(12) United States Patent
Chiou et al.

(10) Patent No.: US 8,603,844 B2
(45) Date of Patent: Dec. 10, 2013

(54) PIXEL STRUCTURE AND MANUFACTURING METHOD THEREOF

(75) Inventors: Chi-Ming Chiou, Taoyuan County (TW); Yu-Tsung Lee, Taoyuan County (TW); Chin-Tzu Kao, Changhua County (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 4 days.

(21) Appl. No.: 13/454,088

(22) Filed: Apr. 24, 2012

(65) Prior Publication Data

US 2013/0175532 A1   Jul. 11, 2013

(30) Foreign Application Priority Data

Jan. 11, 2012   (TW) .............................. 101101079 A

(51) Int. Cl.
*H01L 21/00* (2006.01)
(52) U.S. Cl.
USPC .......................................................... 438/30

(58) Field of Classification Search
USPC ............................................................ 438/30
See application file for complete search history.

(56) References Cited

U.S. PATENT DOCUMENTS

2008/0251789 A1 * 10/2008 Chen ............................... 257/59

* cited by examiner

*Primary Examiner* — Anthony Ho
(74) *Attorney, Agent, or Firm* — Jianq Chyun IP Office

(57) ABSTRACT

A method for manufacturing a pixel structure is provided. A thin film transistor is formed on a substrate and an insulating layer is formed to cover the substrate and the thin film transistor. The insulating layer is patterned by a half-tone mask to form a protruding pattern, a sunken pattern connecting the protruding pattern, and a contact window inside the sunken pattern. A transparent conductive layer is formed to cover the protruding pattern and the sunken pattern, and filled in the contact window. A passivation layer is formed to cover the transparent conductive layer. A pixel electrode pattern is formed from the transparent conductive layer by removing a part of the passivation layer located on the protruding pattern, a part of the transparent conductive layer on the protruding pattern, and a part of the passivation layer located within the contact window. A pixel structure manufactured by the method is provided.

10 Claims, 12 Drawing Sheets

PIXEL STRUCTURE AND MANUFACTURING METHOD THEREOF

CROSS-REFERENCE TO RELATED APPLICATION

This application claims the priority benefit of Taiwan application serial no. 101101079, filed on Jan. 11, 2012. The entirety of the above-mentioned patent application is hereby incorporated by reference herein and made a part of this specification.

BACKGROUND OF THE INVENTION

1. Field of the Invention

The invention relates to a pixel structure and a manufacturing method thereof, and more particularly relates to a pixel structure and a manufacturing method thereof using a half-tone mask manufacturing process.

2. Description of Related Art

Nowadays, multimedia technology has been well developed, which mostly benefits from an advancement of semiconductor devices and display apparatuses. As for displays, thin film transistor liquid crystal displays (TFT-LCD) with superior features such as high definition, good space utilization, low power consumption and no radiation have gradually become the mainstream of the market. In general, a TFT-LCD is mainly assembled through a thin film transistor array substrate, a color filter substrate, and a liquid crystal layer sandwiched between the two substrates.

Conventional thin film transistor array substrates include a plurality of scan lines, a plurality of data lines, and a plurality of pixel structures. In detail, each pixel structure includes a thin film transistor and a pixel electrode. The thin film transistor includes a gate electrode electrically connected to the scan line, a channel layer located on the gate electrode, and a source electrode and a drain electrode located on the channel layer. The source electrode is electrically connected to the data lines. The pixel electrode is electrically connected to the drain electrode.

In conventional technology, when manufacturing the pixel structure, the layers deposited on the substrate must be patterned, respectively, in order to form the required components. In further detail, conventional pixel structures are mostly formed through the sequential patterning of a first metal layer, a first insulating layer, a semiconductor layer, a second metal layer, a second insulating layer, and a transparent conductive layer. Specifically, after the first metal layer is patterned, the scan line and the gate electrode are formed. After the semiconductor layer is patterned, the channel layer is formed. After the second metal layer is patterned, the data line and the drain electrode and the source electrode covering the two opposite sides of the channel layer are formed. After the second metal layer is patterned, the second insulating layer is formed above the data line, the drain electrode, and the source electrode. Next, the second insulating layer is patterned to form a contact window. The contact window passes through the second insulating layer and exposes the drain electrode of the thin film transistor. Next, the transparent conductive layer is formed on the second insulating layer. Finally, the transparent conductive layer is patterned to form a pixel electrode pattern. The pixel electrode pattern is electrically connected to the drain electrode of the thin film transistor through the contact window.

Since the layers (i.e. the first metal layer, the semiconductor layer, the second metal layer, the second insulating layer, and the transparent conductive layer) must be respectively patterned, the manufacture of conventional pixel structures uses multiple mask processes. However, each mask process requires time and cost. Therefore, when considering time and cost, how to reduce the use of masks in a problem researchers are trying to solve.

SUMMARY OF THE INVENTION

The invention provides a manufacturing method of a pixel structure, which saves cost by reducing the number of masks.

The invention provides a pixel structure with low manufacture cost.

The invention provides a manufacturing method of a pixel structure. The manufacturing method includes the following steps. A substrate is provided, and a thin film transistor is formed on the substrate. An insulating layer is formed on the substrate, so as to cover the substrate and the thin film transistor. Next, the insulating layer is patterned by a half-tone mask, so as to form a protruding pattern, a sunken pattern connected the protruding pattern, and a contact window located inside the sunken pattern. The protruding pattern is thicker than the sunken pattern. The contact window passes through the sunken pattern and exposes a drain electrode of the thin film transistor. A transparent conductive layer is formed on the substrate, so as to cover the protruding pattern and the sunken pattern, and is filled in the contact window. Next, a passivation layer is formed, so as to cover the transparent conductive layer. Finally, a part of the passivation layer located on the protruding pattern, a part of the transparent conductive layer on the protruding pattern, and a part of the passivation layer located within the contact window are removed, so that a pixel electrode pattern is formed from the transparent conductive layer.

The invention provides a pixel structure, including a substrate, a thin film transistor, an insulating layer, and a pixel electrode pattern. The thin film transistor is disposed on the substrate. The insulating layer covers the thin film transistor. The insulating layer includes a protruding pattern and a sunken pattern connected to the protruding pattern. The protruding pattern is thicker than the sunken pattern. The sunken pattern includes a contact window. The contact window exposes a drain electrode of the thin film transistor. The pixel electrode pattern is disposed on the insulating layer and filled in the contact window, and is electrically connected with the drain electrode of the thin film transistor.

In an embodiment of the invention, the method of removing a part of the passivation layer located on the protruding pattern and a part of the transparent conductive layer so that a pixel electrode pattern is formed from the transparent conductive layer includes the following steps. A part of the passivation layer located on the protruding pattern is removed, so as to expose a part of the transparent conductive layer. The part of the transparent conductive layer exposed by the passivation layer is removed, so as to form the pixel electrode pattern.

In an embodiment of the invention, the step of removing a part of the passivation layer located on the protruding pattern so as to expose a part of the transparent conductive layer includes: performing an ashing process towards the passivation layer.

In an embodiment of the invention, in the step of forming the insulating layer on the substrate so as to cover the substrate and the thin film transistor, the insulating layer is formed on the substrate to entirely cover the substrate and the thin film transistor.

In an embodiment of the invention, the insulating layer includes a first surface and a second surface opposite to each other. The first surface of the insulating layer is contacted to the thin film transistor. The second surface of the insulating layer is a surface substantially parallel to the substrate.

In an embodiment of the invention, a material of the insulating layer includes an organic photoresist.

In an embodiment of the invention, the step of forming the transparent conductive layer on the substrate to cover the protruding pattern, the sunken pattern, and to be filled in the contact window includes: forming the transparent conductive layer on the substrate to entirely cover the protruding pattern, the sunken pattern, and the contact window.

In an embodiment of the invention, in the step of forming the passivation layer to cover the transparent conductive layer, the passivation layer is formed to entirely cover the transparent conductive layer.

In an embodiment of the invention, the passivation layer includes a first surface and a second surface opposite to each other. The first surface of the passivation layer is contacted to the transparent conductive layer. The second surface of the passivation layer is a surface substantially parallel to the substrate.

In an embodiment of the invention, the pixel electrode pattern covers the sunken pattern and does not cover the protruding pattern.

In an embodiment of the invention, an orthogonal projection of the pixel electrode pattern on the substrate substantially coincides with an orthogonal projection of the sunken pattern on the substrate.

In an embodiment of the invention, the protruding pattern covers a channel layer of the thin film transistor. The sunken pattern covers the drain electrode of the thin film transistor, and does not cover the channel layer of the thin film transistor.

In an embodiment of the invention, the pixel structure further includes data lines and scan lines intersecting each other. The data lines are electrically connected to the drain electrode of the thin film transistor, and the scan lines are electrically connected to the gate electrode of the thin film transistor.

In an embodiment of the invention, the protruding pattern covers the channel layer, the data lines, and the scan lines of the thin film transistor.

Based on the above, in the manufacturing process of the pixel structure of the invention, the insulating layer is patterned by a half-tone mask to form the protruding pattern and the sunken pattern with height difference. The protruding pattern and the sunken pattern are used to define the pixel electrode pattern. This further allows the manufacture of the pixel structure of the invention to require fewer masks. Thus, the manufacturing cost of the pixel structure of the invention can be effectively lowered.

Other features and advantages of the invention will be further understood from the further technological features disclosed by the embodiments of the invention wherein there are shown and described embodiments of this invention, simply by way of illustration of modes best suited to carry out the invention.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

FIG. 1A to FIG. 12A are schematic top views illustrating the manufacture process of a pixel structure according to an embodiment of the invention.

FIG. 1B to FIG. 12B are schematic cross-sectional views respectively taken along line A-A' in the corresponding FIG. 1A to FIG. 12A.

DESCRIPTION OF EMBODIMENTS

Manufacturing Process of Pixel Structure

FIG. 1A to FIG. 12A are schematic top views illustrating the manufacture process of a pixel structure according to an embodiment of the invention. FIG. 1B to FIG. 12B are schematic cross-sectional views respectively taken along line A-A' in the corresponding FIG. 1A to FIG. 12A. It should be noted that in FIG. 1A to FIG. 12A, if a boundary of a layer substantially overlaps with another layer, the schematic top views only label the top most layer. Thus, FIG. 1A to FIG. 12A have omitted the references for some of the components. Please refer to the corresponding schematic cross-sectional views (i.e. FIG. 1B to FIG. 12B) at the same time. The following uses FIG. 1A to FIG. 12A and FIG. 1B to FIG. 12B to describe the manufacturing process of the pixel structure of an embodiment of the invention.

Figure 1A:
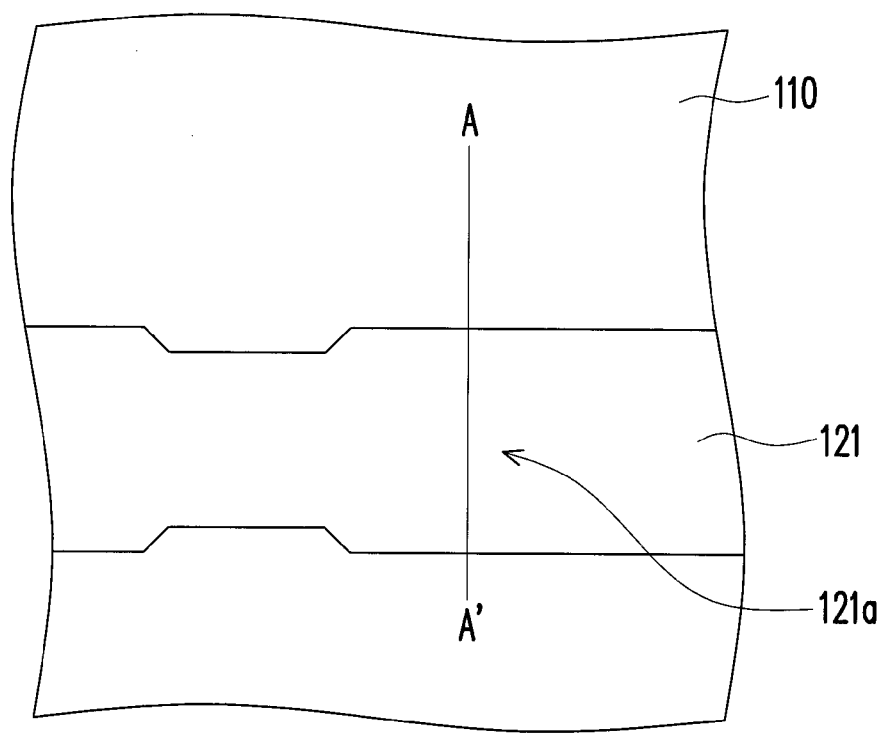
Figure 1B:
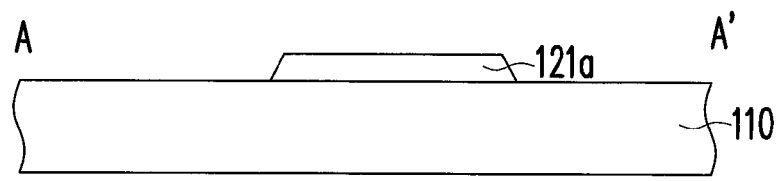

Referring to FIG. 1A and FIG. 1B, a first metal layer (not shown) is first formed on a substrate 110. Next, the first metal layer is patterned to form a gate electrode 121a and a scan line 121 electrically connected to the gate electrode 121a. In the embodiment, the gate electrode 121a can be a part of the scan line 121. However, the invention is not limited thereto. In other embodiments, the gate electrode 121a can also be a branch extended from the scan line 121. In the embodiment, the gate electrode 121a and the scan line 121 use metal material. However, the invention is not limited thereto. In other embodiments, the scan line 121 and the gate electrode 121a can use other conductive materials. The conductive materials include, for example, an alloy, a nitride of a metal material, an oxide of a metal material, an oxynitride of a metal material, or a stacked layer of a metal material and other conductive materials.

Figure 2A:
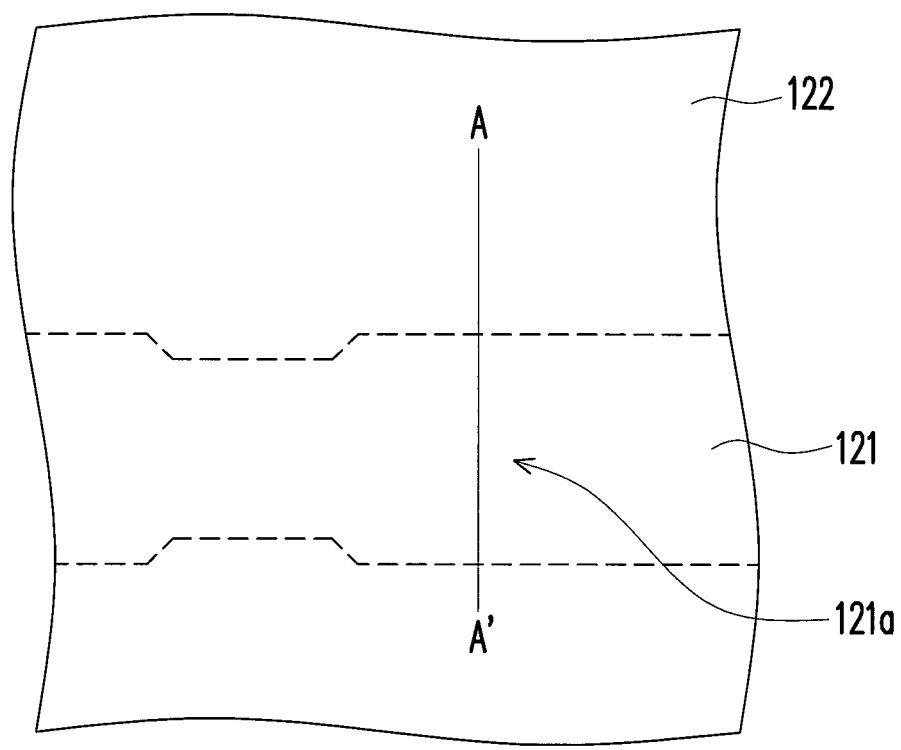
Figure 2B:
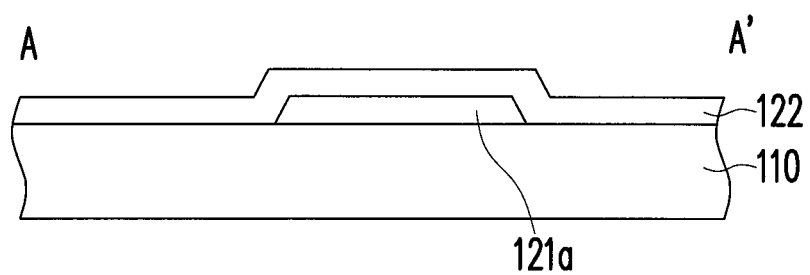

Referring to FIG. 2A and FIG. 2B, next a gate insulating layer 122 is formed on the gate 110. In the embodiment, the gate insulating layer 122, for example, entirely covers the substrate 110, the gate electrode 121a, and the scan line 121. In the embodiment, a material of the gate insulating layer 122 can be inorganic material (such as silicon oxide, silicon nitride, silicon oxynitride, or a combination of at least two of the materials), organic material, or a combination thereof.

Figure 3A:
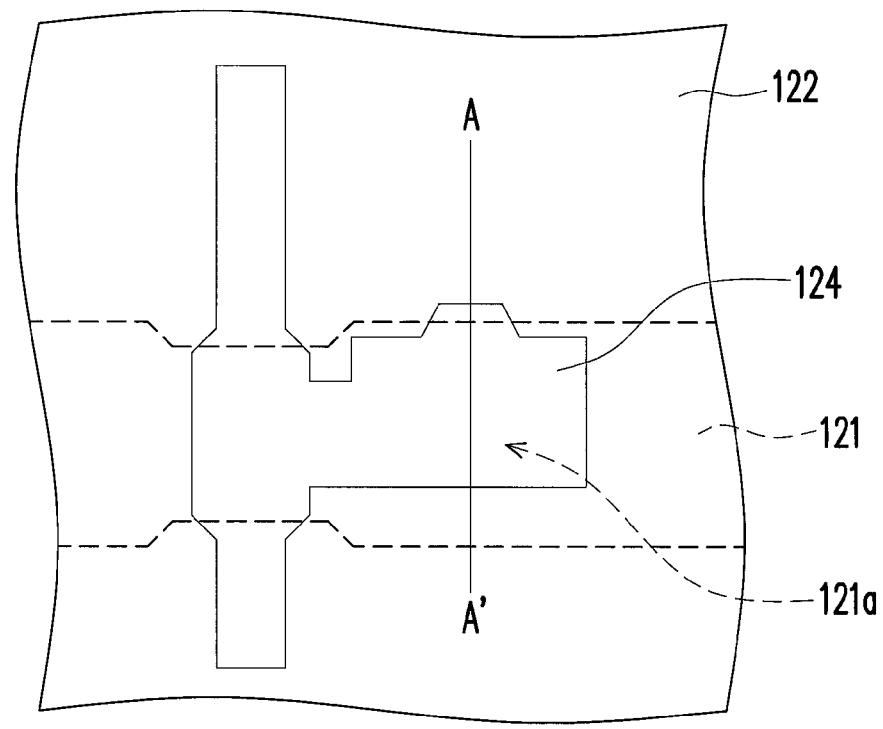
Figure 3B:
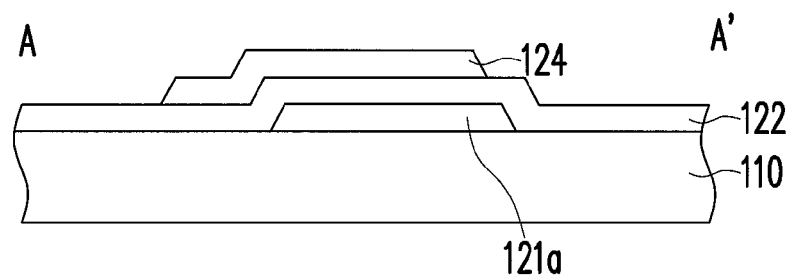

Referring to FIG. 3A and FIG. 3B, a semiconductor layer (not shown) is formed on the gate insulating layer 122. Then, the semiconductor layer is patterned to form a channel layer 124. The channel layer 124 overlaps with the gate electrode 121a. A material of the channel layer 124 is a material such as crystal silicon, amorphous silicon, polysilicon, or oxide.

Figure 4A:
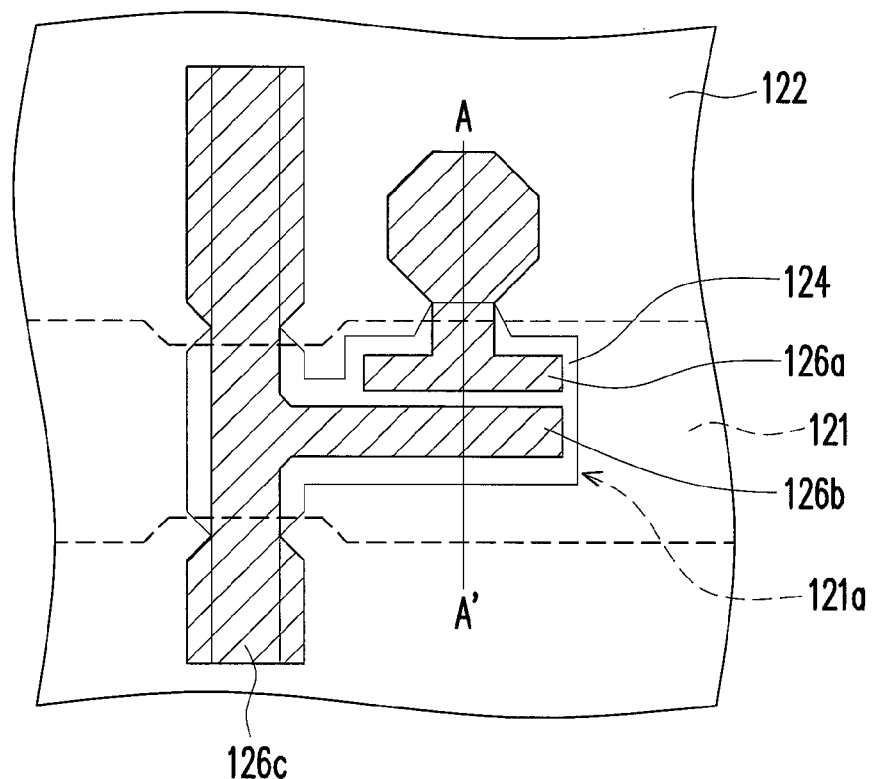
Figure 4B:
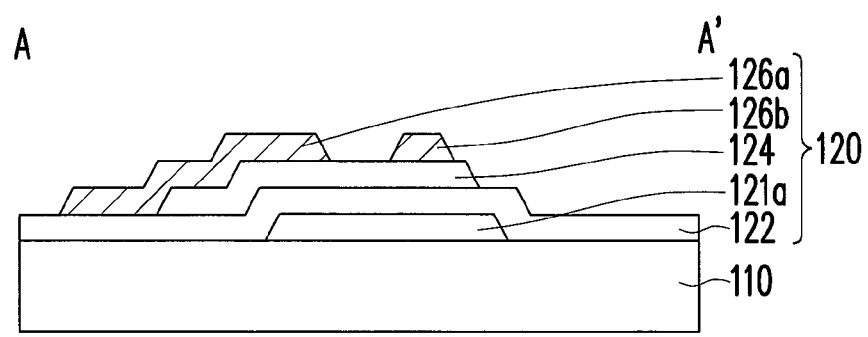

Referring to FIG. 4A and FIG. 4B, next a second metal layer (not shown) is formed to cover the channel layer 124 and the substrate 110. Next, the second metal layer is patterned to form a source electrode 126b, a drain electrode 126a, and a data line 126c electrically connected to the source electrode 126b. Up to here, the initial manufacture of the thin film transistor 120 is completed. It should be noted that the method of forming the thin film transistor 120 is, for example, through a method of forming a bottom gate thin film transistor. However, the invention is not limited thereto. In other embodiments, the thin film transistor 120 can also be a top gate thin film transistor or other types of thin film transistors. The method of forming a top gate thin film transistor or another type of thin film transistor is known to one of ordinary skill in the art, and will not be repeated herein.

Figure 5A:
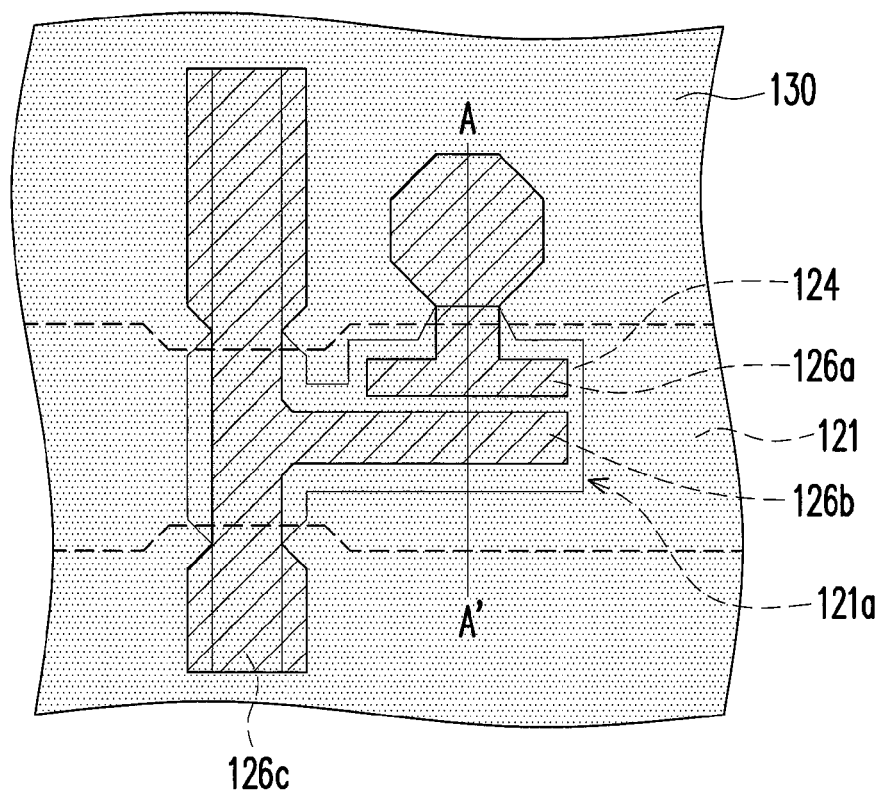
Figure 5B:
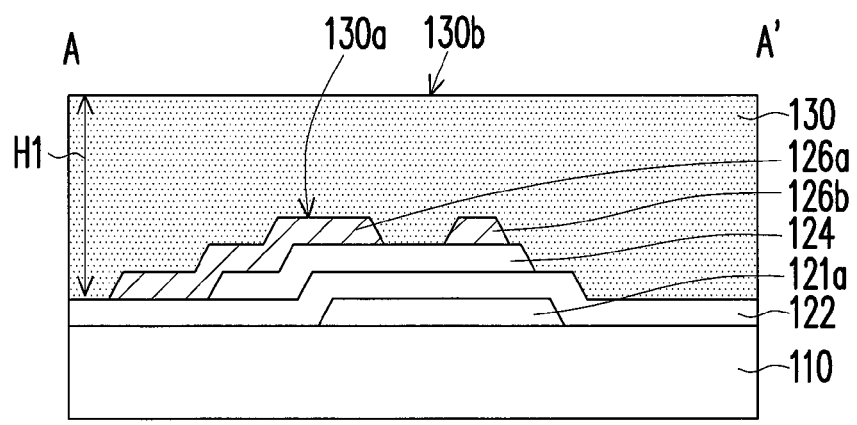

Referring to FIG. 5A and FIG. 5B, next an insulating layer 130 is formed to cover the substrate 110 and the thin film transistor 120. In the embodiment, the insulating layer 130 can entirely cover the substrate 110 and the thin film transistor 120. In detail, the insulating layer 130 includes a first surface 130a and a second surface 130b opposite to each other. The first surface 130a of the insulating layer 130 is contacted to the thin film transistor 120. The second surface 130b of the insulating layer 130 is a surface substantially parallel to the substrate 110. In the embodiment, a material of the insulating layer 130 is an organic photoresist, and the organic photoresist is a positive photoresist. However, the invention is not limited thereto. In other embodiments, the organic photoresist can also be a negative photoresist. In addition, a thickness H1 of the insulating layer 130 is, for example, two micrometers to three micrometers.

Figure 6A:
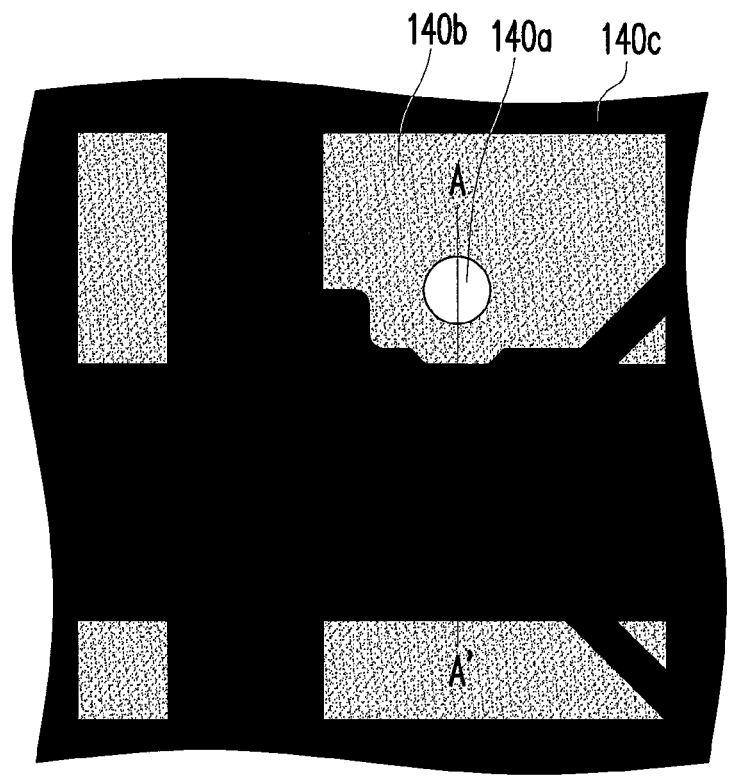
Figure 6B:
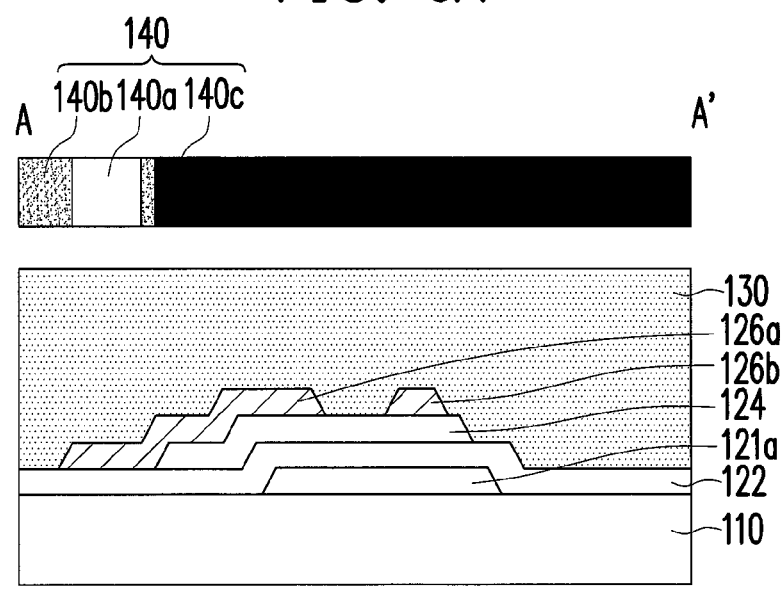

Referring to FIG. 6A and FIG. 6B, a half-tone mask 140 is used to pattern the insulating layer 130. In the embodiment, the half-tone mask 140, for example, includes three patterns 140a, 140b, and 140c with different transparencies. The transparency of the pattern 140b is, for example, between the transparencies of the pattern 140a and the pattern 140c. In further detail, the pattern 140a is, for example, completely transparent, the pattern 140c is, for example, not transparent, and the pattern 140b has a transparency between the pattern 140a and the pattern 140c.

Figure 7A:
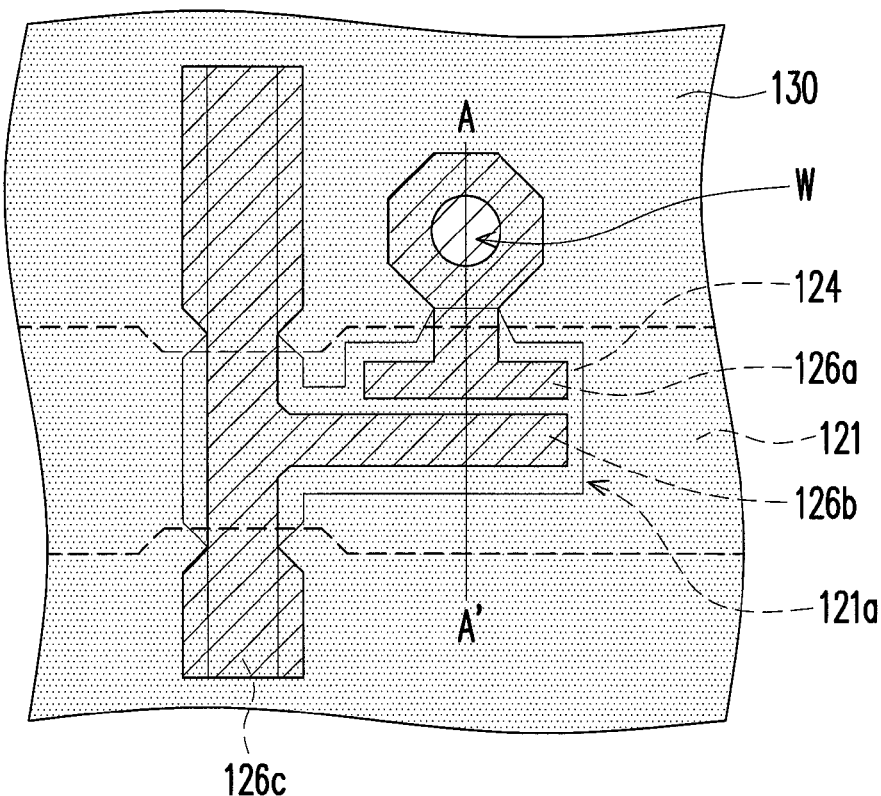
Figure 7B:
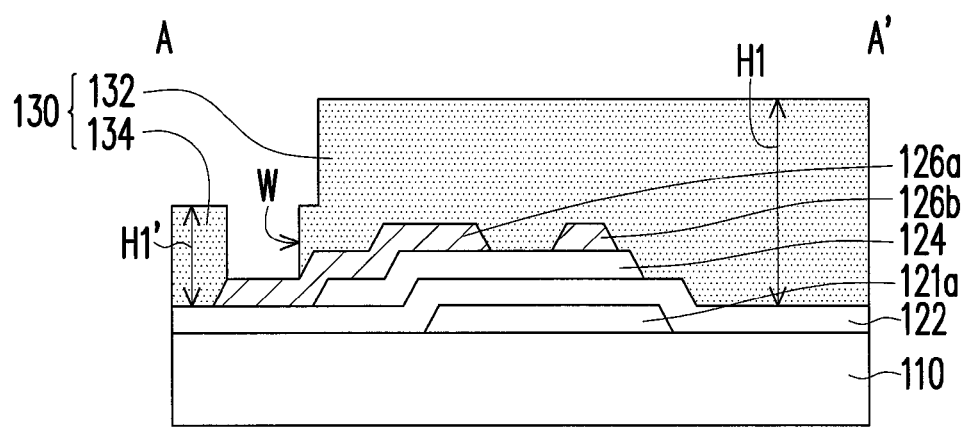

Referring to FIG. 7A and FIG. 7B, after the half-tone mask 140 is used to expose the insulating layer 130, a photolithography process is performed so that the insulating layer 130 forms a protruding pattern 132, a sunken pattern 134 connected to the protruding pattern 132, and a contact window W disposed inside the sunken pattern 134. The contact window W passes through the sunken pattern 134 to expose the drain electrode 126a of the thin film transistor 120. In further detail, in the embodiment, the contact window can be formed through the pattern 140a with the highest transparency. The sunken pattern 134 can be formed using the pattern 140b with the second highest transparency. The protruding pattern 132 can be formed using the pattern 140c with the lowest transparency. In the embodiment, the protruding pattern 132 covers the channel layer 124, the data line 126c, and the scan line 121 of the thin film transistor 120. The sunken pattern 134 covers the drain electrode 126a of the thin film transistor 120 and does not cover the channel layer 124 of the thin film transistor 120. In addition, the thickness H1 of the protruding pattern 132 is greater than a thickness H1' of the sunken pattern 134.

Figure 8A:
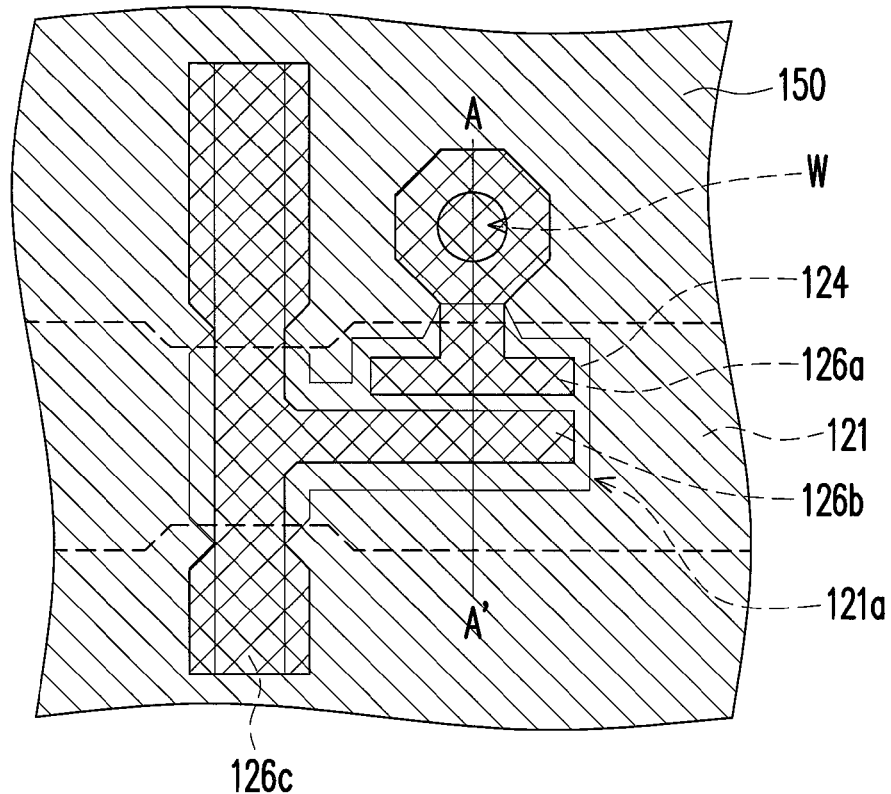
Figure 8B:
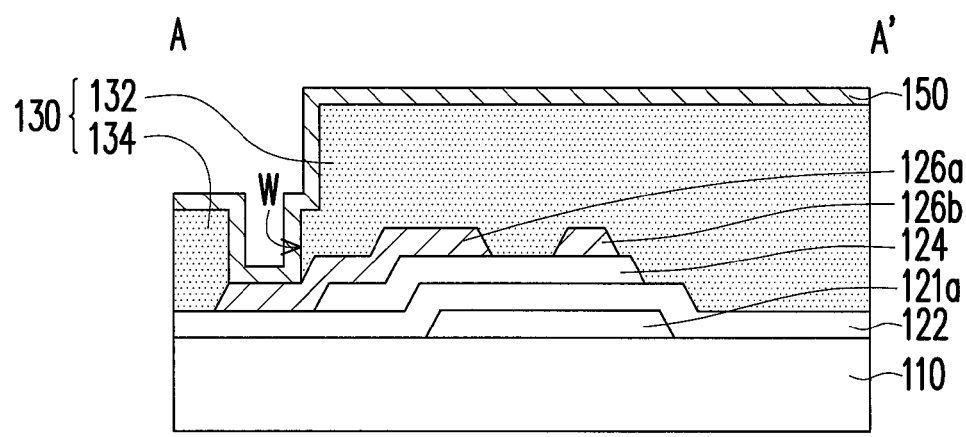

Referring to FIG. 8A and FIG. 8B, next, a transparent conductive layer 150 is formed on the substrate 110, so as to cover the protruding pattern 132 and the sunken pattern 134, and is filled in the contact window W. In the embodiment, the transparent conductive layer 150, for example, entirely covers the protruding pattern 132, the sunken pattern 134, and the contact window W. In the embodiment, a material of the transparent conductive layer 150 can be a metal oxide, for example, indium tin oxide (ITO), indium zinc oxide (IZO), aluminum tin oxide (ATO), aluminum zinc oxide (AZO), indium germanium zinc oxide (IGZO), other suitable oxides, or a stacked layer of at least two of the above.

Figure 9A:
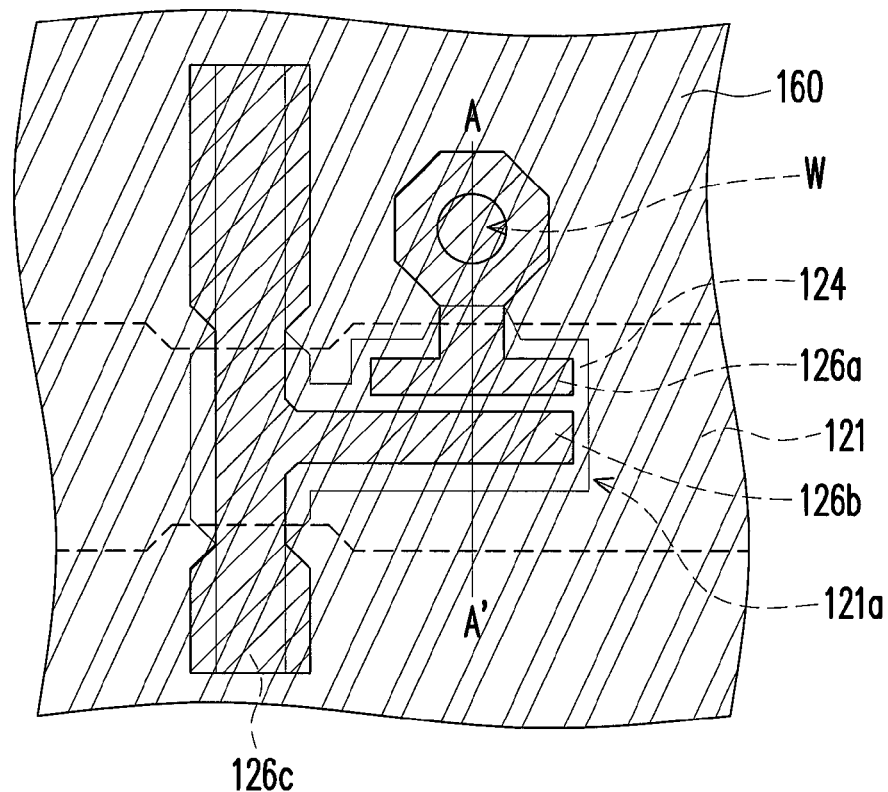
Figure 9B:
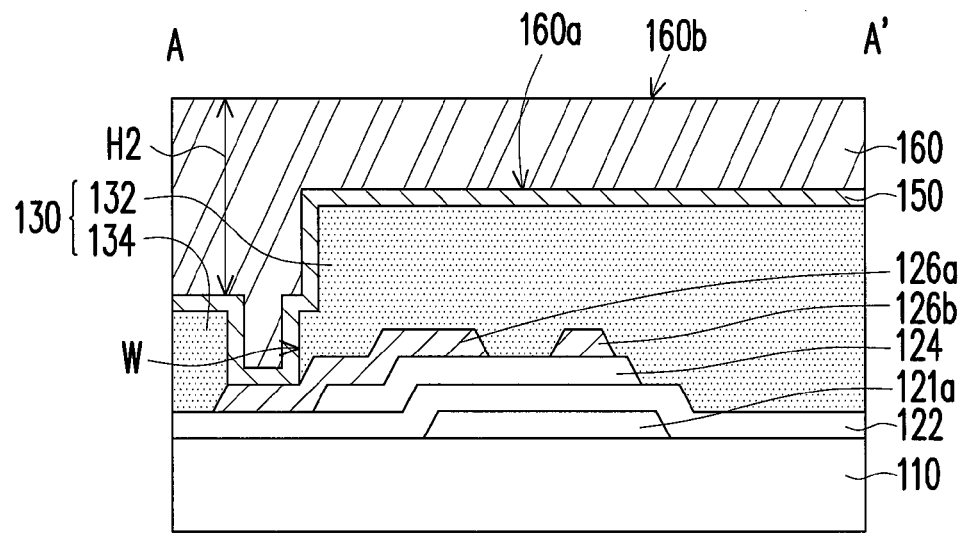

Referring to FIG. 9A and FIG. 9B, next a passivation layer 160 is formed on the substrate 110, so as to cover the transparent conductive layer 150. In the embodiment, the passivation layer 160 entirely covers the transparent conductive layer 150. A material of the passivation layer 160 of the embodiment is inorganic photoresist. That is to say, conventional technology uses the patterning of the first metal layer and the second metal layer to respectively form the photoresist of the gate electrode, the drain electrode, and the source electrode, but the invention is not limited thereto. In addition, the passivation layer 160 for example, entirely covers the transparent conductive layer 150. In detail, the passivation layer 160 includes a first surface 160a and a second surface 160b opposite to each other. The first surface 160a of the passivation layer 160 contacts the transparent conductive layer 150. The second surface 160b of the passivation layer 160 is a surface substantially parallel to the substrate 110. In the embodiment, a thickness H2 of the passivation layer 160 is, for example, between 1 and 2.2 micrometers.

Figure 10A:
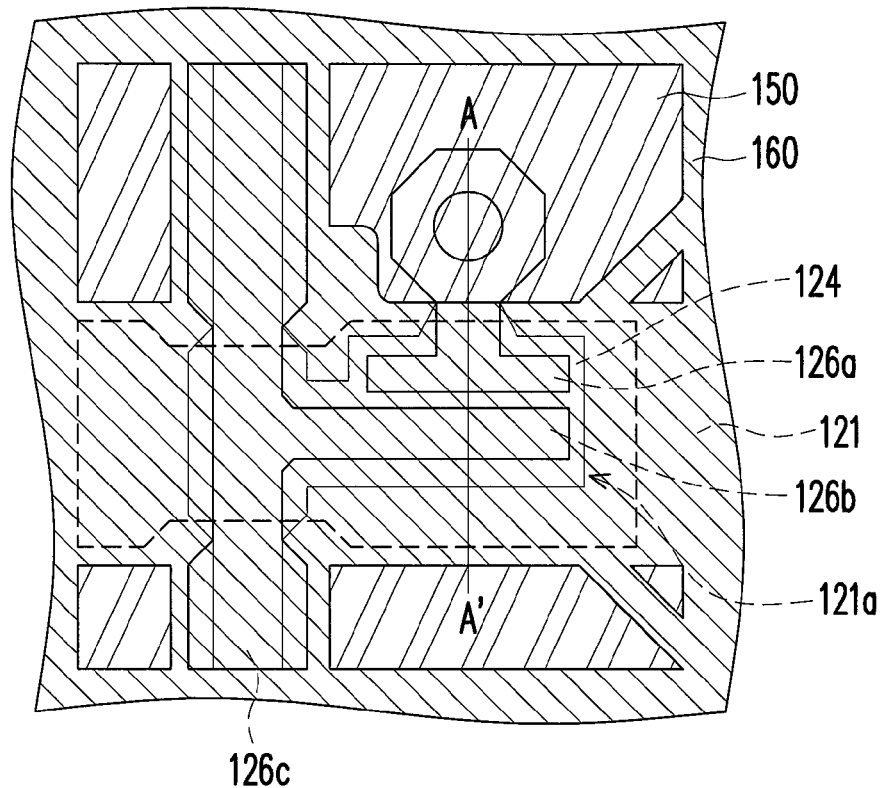
Figure 10B:
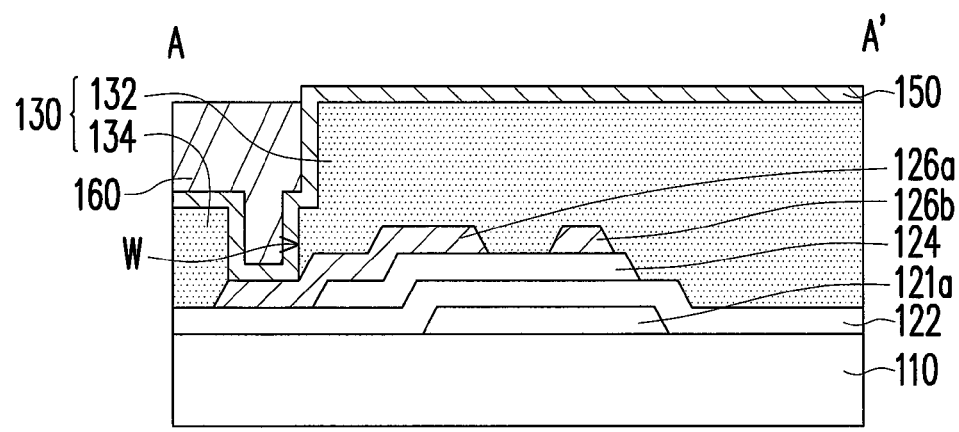

Referring to FIG. 10A and FIG. 10B, next, the step of removing the inorganic photoresist can be performed. In the embodiment, the method of removing the inorganic photoresist layer is by, for example, performing an ashing process towards the passivation layer 160. In detail, in the embodiment, the method of ion-bombardment of plasma etching can be used to remove a part of the passivation layer 160. After a part of the passivation layer 160 is removed, the part of the passivation layer 160 located on the protruding pattern 132 is removed, so as to expose a part of the transparent conductive layer 150. On the other hand, a part of the passivation layer 160 is still left on the sunken pattern 134.

Figure 11A:
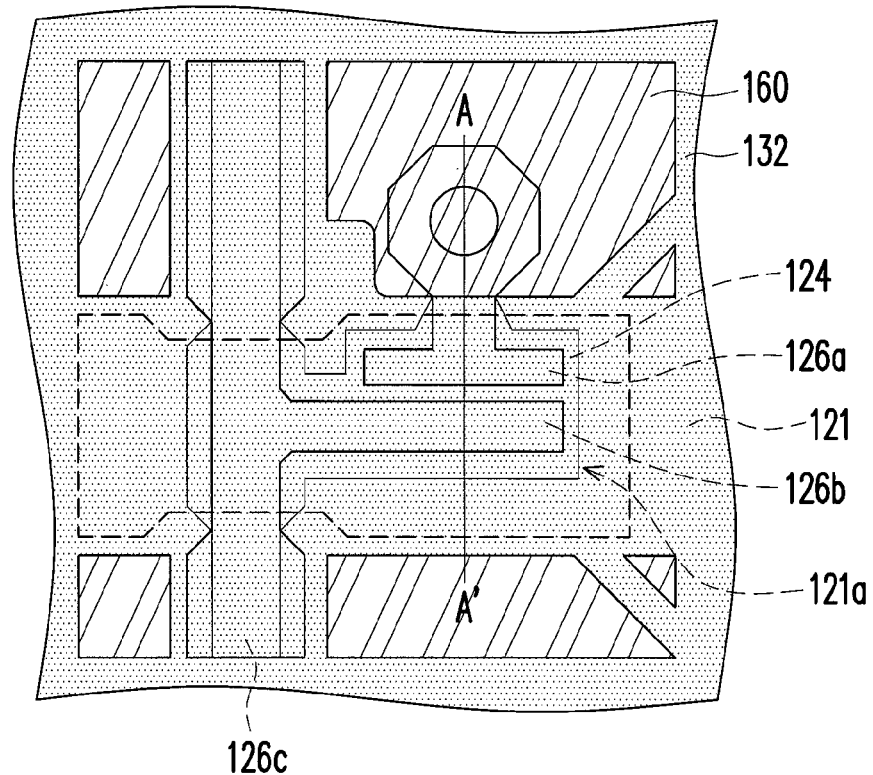
Figure 11B:
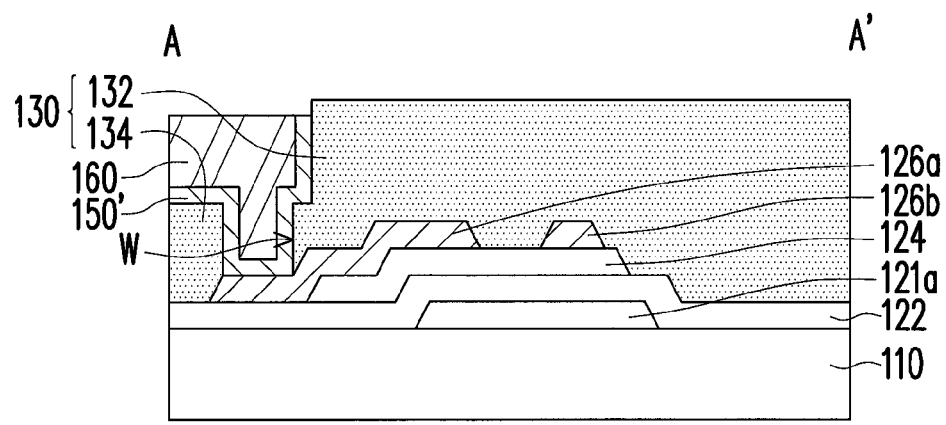

Referring to FIG. 11A and FIG. 11B, next, the part of the transparent conductive layer 150 exposed by the passivation layer 160 is removed, so that the transparent conductive layer 150 forms a pixel electrode pattern 150'. In the embodiment, the part of the transparent conductive layer 150 can be removed through an etching method. The etching method is not limited to dry etching or wet etching. In addition, since the part of the transparent conductive layer 150 on the protruding pattern 132 is removed, the protruding pattern 132 is exposed.

Figure 12A:
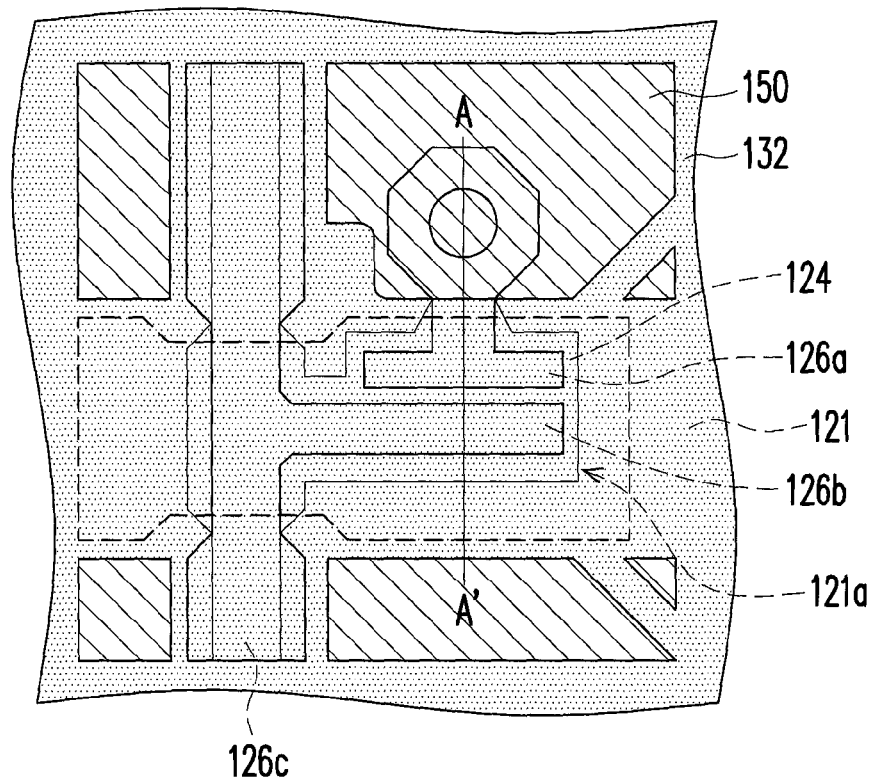
Figure 12B:
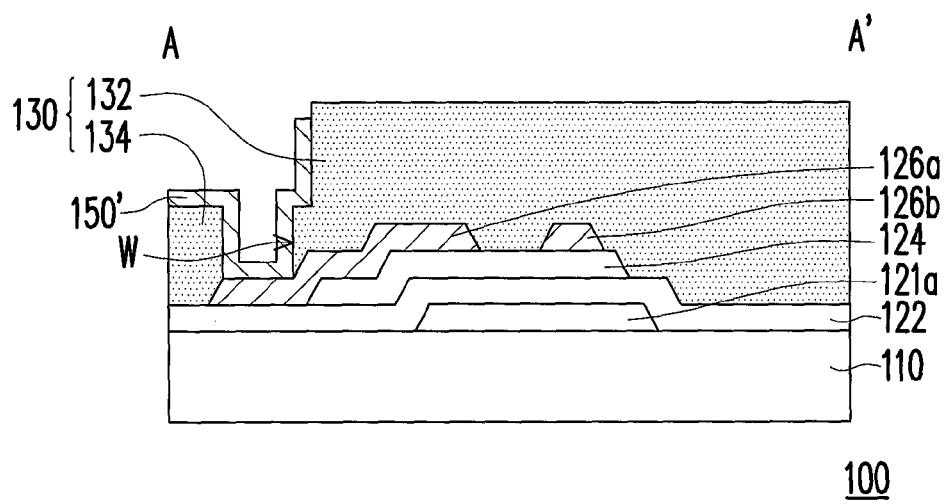

Referring to FIG. 12A and FIG. 12B, next, the part of the passivation layer 160 still left on the sunken pattern 134 and the contact window W is removed, so as to expose the pixel electrode pattern 150'. In detail, in the embodiment, photoresist stripping can be used to remove the part of the passivation layer 160 still left on the sunken pattern 134 and the contact window W. Up to here, the pixel structure 100 of the embodiment is completely manufactured.

It should be noted that, in the manufacturing process of the pixel structure 100 of the embodiment, the insulating layer 130 is patterned by a half-tone mask 140 to form the protruding pattern 132 and the sunken pattern 134 with height difference. The sunken pattern 134 is used to define the pixel electrode pattern 150'. This further allows the manufacture of the pixel structure 100 to require fewer masks. Thus, the manufacturing cost of the pixel structure 100 of the embodiment can be effectively lowered. In addition, the method of the protruding pattern 132 and the sunken pattern 134 with height difference used to define the pixel electrode pattern 150' can be applied in any structure that requires an insulating layer and a pixel electrode. For example, the method can be applied in the manufacturing process of a touch panel, a transflective panel, an IPS panel, or an FFS panel.

Referring to FIG. 12A and FIG. 12B, the pixel structure 100 of the embodiment includes a substrate 110, a thin film transistor 120, an insulating layer 130, and a pixel electrode pattern 150'. The thin film transistor 120 is disposed on the substrate 110. The thin film transistor 120 includes a gate electrode 121a, a gate insulating layer 122, a channel layer 124, a source electrode 126b, and a drain electrode 126a.

As seen in FIG. 12A, the pixel structure 100 of the embodiment can further include a data line 126c and a scan line 121. The data line 126c is electrically connected to the source electrode 126b of the thin film transistor 120. The scan line 121 is electrically connected to the gate electrode 121a of the thin film transistor 120.

The insulating layer 130 of the embodiment covers the thin film transistor 120. In further detail, the insulating layer 130 includes a protruding pattern 132 and a sunken pattern 134. The sunken pattern 134 is connected to the protruding pattern 132. The protruding pattern 132 exposes a drain electrode 126a of the thin film transistor 120. In detail, the protruding pattern 132 covers the channel layer 124, the data line 126c, and the scan line 121 of the thin film transistor 120. The sunken pattern 134 covers the drain electrode 126a of the thin film transistor 120 and does not cover the channel layer 124 of the thin film transistor 120. In addition, the thickness H1 of the protruding pattern 132 is greater than a thickness H1' of the sunken pattern 134.

The pixel electrode pattern 150' of the embodiment is disposed on the insulating layer 130 and filled in the contact window W, so that the pixel electrode pattern 150' is electrically connected with the drain electrode 126a of the thin film transistor 120. It should be noted that the pixel electrode pattern 150' covers the sunken pattern 134 and does not cover the protruding pattern 132. In addition, an orthogonal projection of the pixel electrode pattern 150' on the substrate 110 substantially coincides with an orthogonal projection of the sunken pattern 134 on the substrate 110. In the manufacturing process of the pixel structure 100 of the embodiment, a method of the protruding pattern 132 and the sunken pattern 134 with height difference used to define the pixel electrode pattern 150' can be used. Therefore, the manufacture of the pixel structure 100 requires fewer masks. In other words, the pixel structure 100 of the embodiment has the advantage of being low cost.

To sum up, in the manufacturing process of the pixel structure of an embodiment of the invention, the insulating layer is patterned by a half-tone mask to form the protruding pattern and the sunken pattern with height difference. The protruding pattern and the sunken pattern are used to define the pixel electrode pattern. This further allows the manufacture of the pixel structure of an embodiment of the invention to require fewer masks. Thus, the manufacturing cost of the pixel structure of an embodiment of the invention can be effectively lowered. In addition, the pixel structure can have the advantage of being low cost.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing a pixel structure, comprising:
    providing a substrate;
    forming a thin film transistor on the substrate;
    forming an insulating layer on the substrate, so as to cover the substrate and the thin film transistor;
    patterning the insulating layer by a half-tone mask so as to form a protruding pattern, a sunken pattern connected to the protruding pattern, and a contact window disposed inside the sunken pattern, wherein the protruding pattern is thicker than the sunken pattern, and the contact window passed through the sunken pattern and exposes a drain electrode of the thin film transistor;
    forming a transparent conductive layer on the substrate, so as to cover the protruding pattern and the sunken pattern, and is filled in the contact window;
    forming a passivation layer, so as to cover the transparent conductive layer; and
    removing a part of the passivation layer located on the protruding pattern, a part of the transparent conductive layer on the protruding pattern, and a part of the passivation layer located within the contact window, so that a pixel electrode pattern is formed from the transparent conductive layer.

2. The method of manufacturing a pixel structure as claimed in claim 1, wherein the step of removing a part of the passivation layer located on the protruding pattern and a part of the transparent conductive layer so that a pixel electrode pattern is formed from the transparent conductive layer comprises:
    removing a part of the passivation layer located on the protruding pattern, so as to expose a part of the transparent conductive layer; and
    removing the part of the transparent conductive layer exposed by the passivation layer, so as to form the pixel electrode pattern.

3. The method of manufacturing a pixel structure as claimed in claim 2, wherein the step of removing a part of the passivation layer located on the protruding pattern so as to expose a part of the transparent conductive layer comprises: performing an ashing process towards the passivation layer.

4. The method of manufacturing a pixel structure as claimed in claim 1, wherein the step of forming the insulating layer on the substrate so as to cover the substrate and the thin film transistor comprises:
    forming the insulating layer on the substrate to entirely cover the substrate and the thin film transistor.

5. The method of manufacturing a pixel structure as claimed in claim 1, wherein the insulating layer includes a first surface and a second surface opposite to each other, the first surface of the insulating layer is contacted to the thin film transistor, and the second surface of the insulating layer is a surface substantially parallel to the substrate.

6. The method of manufacturing a pixel structure as claimed in claim 1, wherein a material of the insulating layer comprises: an organic photoresist.

7. The method of manufacturing a pixel structure as claimed in claim 1, wherein the protruding pattern covers a channel layer of the thin film transistor, and the sunken pattern covers a drain electrode of the thin film transistor but does not cover the channel layer of the thin film transistor.

8. The method of manufacturing a pixel structure as claimed in claim 1, wherein the step of forming the transparent conductive layer on the substrate to cover the protruding pattern, the sunken pattern, and to be filled in the contact window comprises:
    forming the transparent conductive layer on the substrate to entirely cover the protruding pattern, the sunken pattern, and the contact window.

9. The method of manufacturing a pixel structure as claimed in claim 1, wherein the step of forming the passivation layer to cover the transparent conductive layer comprises:
    forming the passivation layer to entirely cover the transparent conductive layer.

10. The method of manufacturing a pixel structure as claimed in claim 9, wherein the passivation layer includes a first surface and a second surface opposite to each other, the first surface of the passivation layer is contacted to the transparent conductive layer, and the second surface of the passivation layer is a surface substantially parallel to the substrate.

\* \* \* \* \*